United States Patent [19]
Chen et al.

[11] Patent Number: 6,118,142
[45] Date of Patent: Sep. 12, 2000

[54] CMOS SENSOR

[75] Inventors: Ming-I Chen, Tainan Hsien; Yung-Chieh Fan, Hsinchu, both of Taiwan

[73] Assignee: United Microelectronics Corp., Hsinchu, Taiwan

[21] Appl. No.: 09/189,354

[22] Filed: Nov. 9, 1998

[51] Int. Cl.[7] ............................ H01L 27/148; H01L 29/768
[52] U.S. Cl. ...................... 257/232; 257/233; 257/292; 257/294; 257/436; 257/446; 438/60; 438/69; 438/75
[58] Field of Search ................... 257/233, 232, 257/446, 436, 294, 292; 438/60, 75, 69

[56] References Cited

U.S. PATENT DOCUMENTS

| | | | |
|---|---|---|---|
| 4,450,466 | 5/1984 | Nishizawa et al. | 357/30 |
| 5,578,842 | 11/1996 | Shinji | 257/223 |
| 5,825,071 | 10/1998 | Takakura | 257/440 |
| 5,942,775 | 8/1999 | Yiannoulos | 257/292 |
| 6,026,964 | 3/2000 | Hook et al. | 207/292 |

*Primary Examiner*—William Mintel
*Attorney, Agent, or Firm*—Hickman Coleman & Hughes, LLP

[57] ABSTRACT

A CMOS sensor structure and method of manufacture that includes the fabrication of a special shallow trench isolation structure. Besides isolating the active region for forming the CMOS sensor device, the shallow trench isolation structure has a special reflective plug embedded inside capable of reflecting incoming light onto the sensitive region of the CMOS sensor. Hence, the interactive length of incoming light with the light sensitive region can be increased, thereby increasing the contrast ratio and light sensitivity of the CMOS sensor.

13 Claims, 3 Drawing Sheets

CMOS SENSOR

BACKGROUND OF THE INVENTION

1. Field of Invention

The present invention relates to a complementary metal-oxide-semiconductor (CMOS) sensor. More particularly, the present invention relates to a CMOS sensor fabricated in a substrate having a special shallow trench isolation (STI) structure.

2. Description of Related Art

Charge coupled devices (CCDs) are often employed in digital sensors for image extraction. Its application includes close-circuit TV, camera, and video recorder. However, CCDs are quite costly to produce and bulky. Hence, in order to reduce volume, energy consumption and cost, CMOS photo-diodes that can be formed by semiconductor techniques are a major substitute for CCDs in the future. At present, CMOS photo diodes have been used inside PC cameras and digital cameras.

Photo-diode is a light-sensitive (or light-detecting) semiconductor device that utilizes a P-N junction for converting light energy into electrical signal. Due to the existence of an electric field at the P-N junction, electrons in the N-doped region and holes in the P-doped region cannot diffuse across the P-N junction when no light is shone on the junction. However, when a light beam of sufficient intensity impinges upon the junction region, atoms within the junction region are activated to generate electron-hole pairs. These electron-hole pairs, on reaching the region with an internal electric field, separate from each other. The electrons migrate towards the N-doped region while the holes migrate towards the P-doped region, thereby leading to a current flowing in the P-N junction electrodes. Ideally, the photo diode should be in open-circuit having no electric current flowing when the device is in the dark.

Conventionally, a field oxide (FOX) layer is used as a device isolating structure for a CMOS sensor. FIG. I is a cross-sectional view of a conventional CMOS sensor structure of P-N photo-diodes.

The CMOS sensor is fabricated in several steps. First, a substrate 100 such as a P-type silicon substrate is provided. Then, a field oxide layer 102 is formed over the substrate 100 using a local oxidation method, wherein the field oxide layer 102 serves as a device isolation structure. Thereafter, a P-well is formed in the substrate 100, and then a gate structure 106 is formed over the substrate 100. The gate structure 106 includes a gate electrode 114 and a gate oxide layer 112. In the next step, the gate structure 106 is used as a mask for implanting N-type ion into the substrate 100 to form a lightly doped region. Subsequently, spacers 122 are formed on the sidewalls of the gate structure 106. Next, the gate structure, the spacers 122 and a patterned photoresist layer are used as a mask for implanting N-type ions again into the substrate 100 to form a heavily doped region, and then the photoresist is removed. The lightly doped region and the heavily doped region together form source/drain regions 108 and 118. After that, another photoresist layer is formed over the substrate 100 exposing the desired sensor region, and then another light N-type ion implantation is carried out to form a sensor region 128 encompassing the source/drain region 118.

Since a P-N junction is formed around the border of the sensor region 128, electron-hole pairs are generated when a light beam is incident on this region. The light energy is then transformed into an electrical signal. On the contrary, if the incoming light incident on the substrate 100 without passing through the sensor region 128, no electrical signal is to be generated. It is often that the light passing through the sensor region 128 is commonly dim to only produce a small electrical signal. Consequently, the contrast ratio of this photo-diode device is rather low, in other words, this type of device is not sensitive enough.

Moreover, as chip size continues to shrink, isolating devices with a field oxide layer is infeasible. This is because a field oxide layer occupies a relatively large surface area plus other problems such as bird's beak encroachment.

SUMMARY OF THE INVENTION

Accordingly, the present invention is to provide a CMOS sensor which is formed on a substrate having a shallow trench isolation structure with a reflective layer. As a consequent, the contrast ratio is increased, so that the sensor is more sensitive compared to the prior.

To achieve these and other advantages and in accordance with the purpose of the invention, as embodied and broadly described herein, the invention provides a CMOS sensor that employs a special method of forming shallow trench isolation structure. A substrate having a trench is provided. A dielectric layer is formed along the interior surface of the trench and the substrate. A reflective layer is deposited to partly fill the trench. A second dielectric material is deposited to fill the trench, so that a shallow trench isolation with a plug comprising a reflective layer is formed. Thereafter, conventional methods are used to manufacture a CMOS sensor in the substrate.

According to one embodiment of this invention, material for forming the reflective layer includes material having a high light reflectivity. Suitable metallic materials for forming the reflective layer include tungsten, titanium or tantalum.

The structure of the CMOS sensor structure thus comprises a first-conductive-type well formed in a substrate and isolated by a shallow trench isolation. The shallow trench isolation is partly filled by a reflective layer. A source/drain region and a gate are formed on the first-conductive-type-well. The source/drain region is formed by an ion implantation with a second-conductive-type dopant. In the first-conductive-type well, a second-conductive-type well is formed to encompassing the source/drain region. Typically, the second-conductive-type well is doped with a dosage lighter than the dosage of the source/drain region.

The shallow trench isolation structure formed to isolate the CMOS sensor has a layer fabricated using reflective material. When an incoming light shines on the reflective layer, most of the light will be reflected back towards the sensitive region of the CMOS sensor. Hence, the light intensity of the incoming light shone on the sensor region is increased, and the contrast ratio and light sensitivity of a CMOS sensor is raised considerably.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
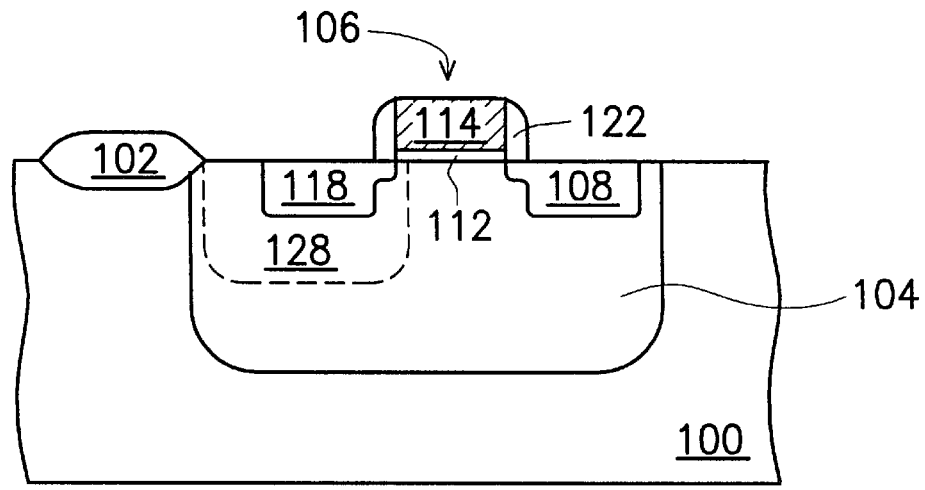
FIG. 1 is a cross-sectional view of a conventional CMOS sensor structure of P-N photo-diodes.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are cross-sectional views showing the progression of manufacturing steps in fabricating a CMOS sensor having an associated shallow trench isolation structure according to one preferred embodiment of this invention.

Figure 2A:
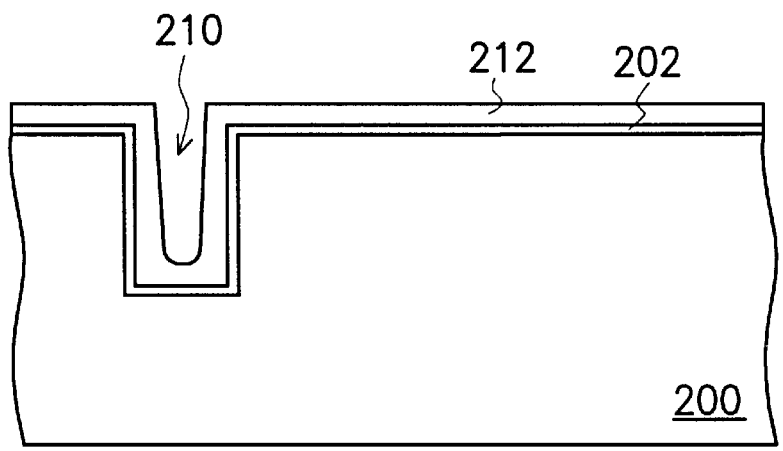
FIGS. 2A through 2H are cross-sectional views showing the progression of manufacturing steps in fabricating a CMOS sensor having an associated shallow trench isolation structure according to one preferred embodiment of this invention.

First, as shown in FIG. 2A, a substrate 200 such as a P-type silicon substrate having a trench 210 is provided. The trench 210 can be formed by, for example, etching a part of the substrate 200 through a hard mask or a patterned photoresist layer. Since these are conventional techniques, detail description of the operation is omitted here. A dielectric layer 202 is formed along the exposed surfaces of the trench 210 and the substrate 200. The dielectric layer 202 may be a silicon oxide ($SiO_x$) layer, a silicon oxide/silicon nitride ($SiN_x$)/silicon oxynitride ($SiN_xO_y$) layer or other materials having similar properties. The silicon oxide may be formed using a thermal oxidation method. Another dielectric layer 212 conformal to the substrate profile is formed over the dielectric layer 202. Preferably, the dielectric layer 212 is a silicon oxide layer, a silicon nitride layer or other material layers having similar properties. The dielectric layer 212 can be formed using a chemical vapor deposition (CVD) method. The dielectric layer 202 and 212 protects the substrate 200 from being damaged in subsequent processes and, at the same time, acts as an electrical insulator.

Figure 2B:
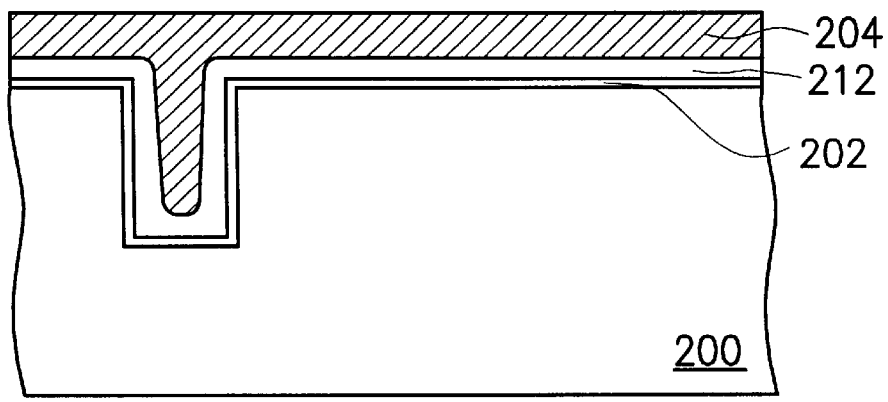

As shown in FIG. 2B, a reflective layer 204 is formed over the dielectric layer 212 and to fill the trench 210 (shown in FIG. 2A). This reflective layer 204 can be made from metal or any materials having a high reflectivity for light. Preferably, the reflective layer 204 is formed from material such as tungsten (W), titanium (Ti) or tantalum (Ta).

Figure 2C:
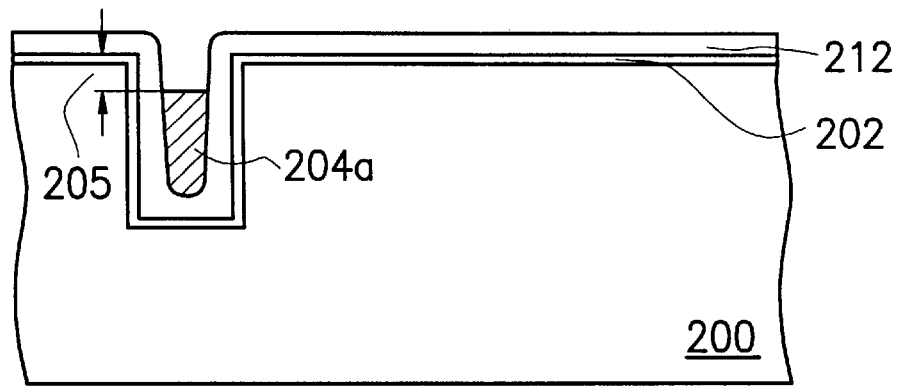

As shown in FIG. 2C, the reflective layer 204 is etched back to expose the dielectric layer 212 and to form a reflective plug 204a. Preferably, the reflective plug 204a having a surface level lower than the surface level of the substrate 200 by a distance denoted as 205. In other words, the reflective plug 204a is formed to occupy a lower part of the trench 210 formed while the upper part of the trench 210 remains vacant.

Figure 2D:
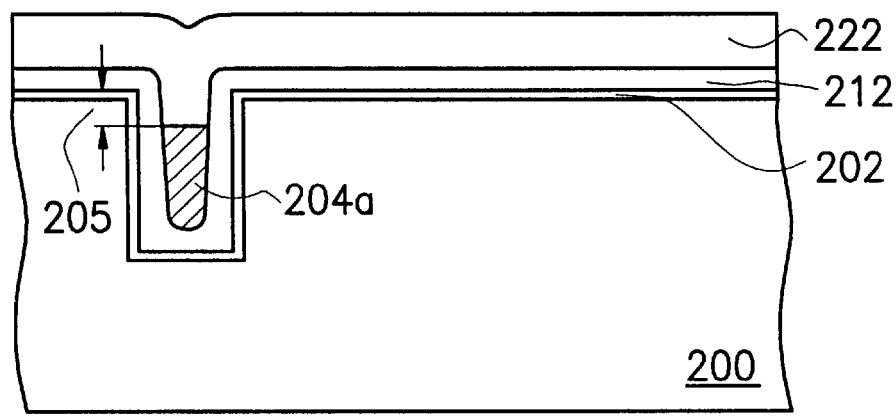

As shown in FIG. 2D, yet another dielectric layer 222 that fills the vacant upper part of the trench 210 is formed over reflective plug 204a and the dielectric layer 212. Preferably, the dielectric layer 222 is formed from material such as silicon oxide or silicon nitride.

Figure 2E:
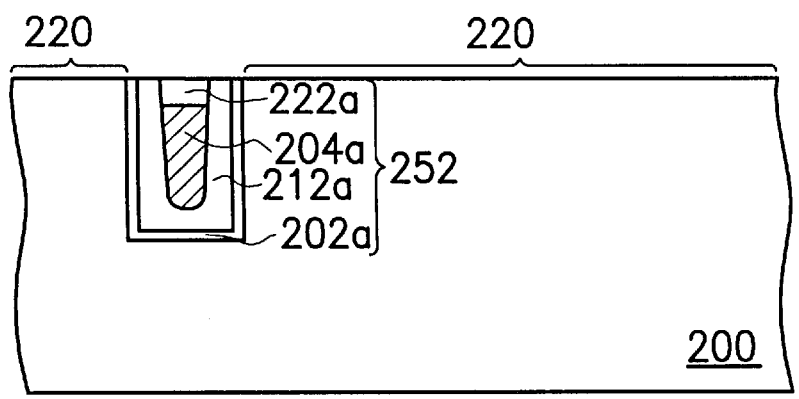

As shown in FIG. 2E, planarization is carried out using, for example, an etching back operation to expose the substrate 200. Therefore, only a portion of the dielectric layer 222 inside the trench 210 is remained, thus forming a dielectric plug 222a. In addition, most of the oxide layer 202 is removed retaining only a portion of the oxide layer 202a within the trench 210. Consequently, a complete shallow trench isolation structure 252 is formed in the substrate 200. The shallow trench isolation structure 252 is used for isolating the devices in the active region 220.

Since the shallow trench isolation structure 252 of this invention can be miniaturized on demand, the structure is particularly suitable for incorporating into the production of highly integrated circuits. Moreover, when the shallow trench isolation structure 252 is formed next to the sensitive region of a CMOS sensor, the reflective plug 204a inside the structure 252 is capable of reflecting back some of the incoming light. Hence, the intensity of electrical signal can be increased for a given light intensity.

Figure 2F:
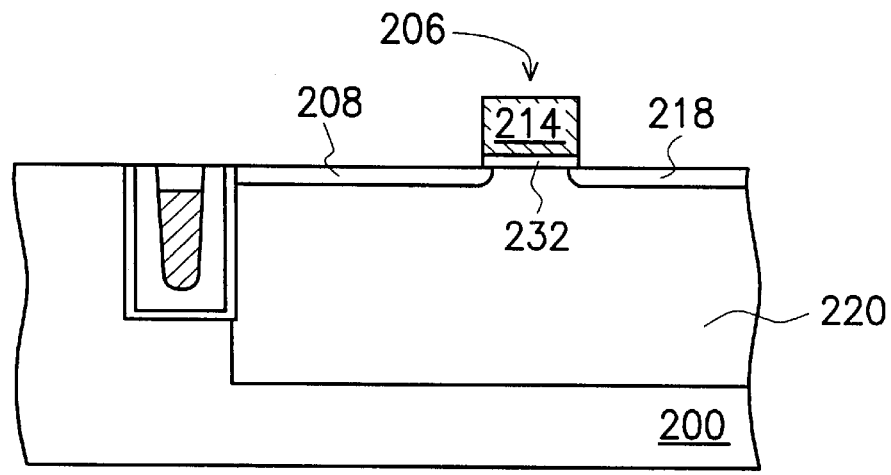
Figure 2G:
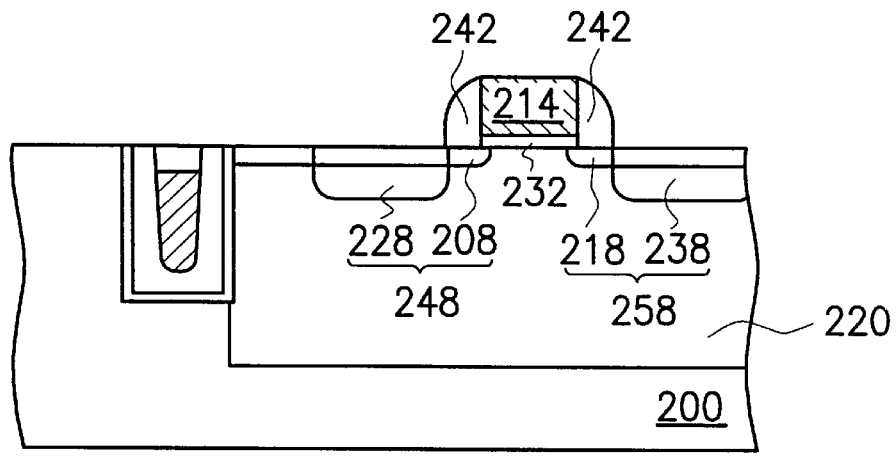
Figure 2H:
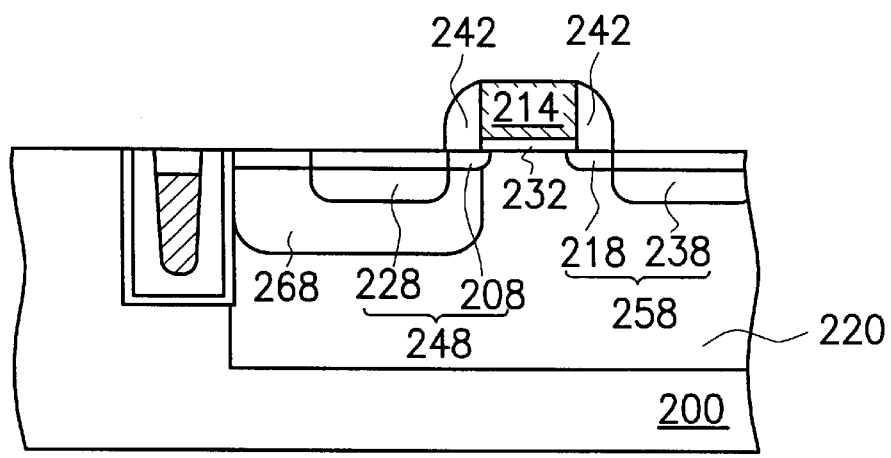

Processes for forming a CMOS sensor in the substrate 200 are carried out. A CMOS sensor comprises an NMOS device and a PMOS device. However, in this embodiment, only the fabrication process for the photo-diode formed in an NMOS device is illustrated. Conventional method is used to form the NMOS device. The progression of manufacturing steps in fabricating the NMOS device is shown in FIGS. 2F through 2H. However, the PMOS can be fabricated using a similar procedure.

As shown in FIG. 2F, a P-well 220 is formed in the substrate 200, and then a gate structure 206 is formed on the P-well 220. The gate structure 206 includes a gate electrode 214 and a gate oxide layer 232. Using the gate structure 206 as a mask, low concentration N-type ions are implanted into the substrate 200 to form lightly doped regions 208 and 218.

As shown in FIG. 2G, spacers 242 are formed on sidewalls of the gate structure 206. The gate structure, the spacers 242 and a photoresist layer (if required, not shown in the figure) are used as masks for implanting high concentration N-type ions into the substrate 200 to form heavily doped regions 228 and 238. The lightly doped region 208 and the heavily doped region 228 together form the source/drain region 248. Similarly, the lightly doped region 218 and the heavily doped region 238 together form the source/drain region 258. The photoresist layer is removed.

As shown in FIG. 2H, another photoresist layer (not shown in the figure) is formed exposing the desired light sensitive region. Low concentration N-type ions are implanted into the substrate 200 to form a lightly doped region, denoted as N⁻region 268. The N⁻ region is ranged within the P-well 220 and encompassing the source/drain region 248, so that a sensor region 268 is formed by the induction of a P-N junction around the border of the $N^{312}$ region 268 in the P-well 220. Typically, the N⁻ region 268 is more lightly doped than the source/drain region 248.

Since the sensor region 268 has a P-N junction interface, electron-hole pairs will be generated when light passes through this region 268. In other words, the incoming light is transformed into an electrical signal. Besides receiving a light beam directly from the light source to generate an electrical signal, the sensor region 268 also picks up reflected light from the reflective plug inside the shallow trench isolation structure 252. Hence, interactive strength of incoming light with the sensor region 268 is enhanced resulting in a greater electrical signal. This benefits the CMOS sensor by increasing its contact ratio and light sensitivity.

A photo-diode, that is, a light sensor may also be made in an N-well using the method mentioned above by interchanging P into N, and N into P.

In summary, the characteristics of this invention includes:
1. The association of a shallow trench isolation structure with a CMOS sensor is capable of increasing the level of integration of these photosensitive devices.

2. Since a reflective plug is incorporated into the shallow trench isolation structure, this invention is capable of reflecting back some of the strayed light onto the sensor region of a CMOS sensor. Consequently, interaction of incoming light with the sensor region is increased, resulting in a greater contrast ratio and light sensitivity for the CMOS sensor.

3. The manufacturing processes used in this invention are compatible with current semiconductor technologies. Hence, the invention can be easily incorporated into existing production facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A CMOS sensor isolated by an isolation structure in a substrate; comprising:

a first-conductive-type well in the substrate;

a gate and a source/drain region on the first-conductive-type well; and a second-conductive-type well encompassing the source/drain region within the first-conductive-type well; wherein the isolation structure is partly filled by a reflective layer.

2. The CMOS sensor according to claim 1, wherein the first-conductive-type includes P type, while the second-conductive-type includes N type.

3. The CMOS sensor according to claim 1, wherein the first-conductive-type includes N type, while the second-conductive-type includes P type.

4. The CMOS sensor according to claim 1, wherein the reflective layer is formed from a material selected from at least one of tungsten, titanium, and tantalum.

5. The CMOS sensor according to claim 1, wherein the isolation structure is formed by the steps of:

providing the substrate with a trench;

forming a first dielectric layer along surfaces of the trench and the substrate;

partly filling, the trench with the reflective layer; and filling the trench with a second dielectric layer.

6. The CMOS sensor according to claim 5, wherein the first dielectric layer includes a silicon oxide layer.

7. The CMOS sensor according to claim 5, wherein the first dielectric layer includes a silicon oxide/silicon nitride/silicon oxynitride.

8. The CMOS sensor according to claim 5, comprising further a step of forming a third dielectric layer conformal to the first dielectric layer before filling the reflective layer.

9. The CMOS sensor according to claim 8, wherein the third dielectric layer includes a silicon oxide layer.

10. The CMOS sensor according to claim 8, wherein the third dielectric layer includes a silicon nitride layer.

11. The CMOS sensor according to claim 5, wherein the second dielectric layer includes a silicon oxide layer.

12. The CMOS sensor according to claim 5, wherein the second dielectric layer includes a silicon nitride layer.

13. A shallow trench isolation structure to isolate a region having a CMOS sensor in a substrate, comprises:

a trench, formed in the substrate;

a first dielectric layer, covering along an interior surface of the trench;

a second dielectric layer, conformal to and on the first dielectric layer;

a reflective plug, filling a lower part of the trench on the second dielectric layer; and a third dielectric layer, filling an upper part of the trench on the reflective plug.

* * * * *